United States Patent [19]
Roberts, Jr. et al.

[11] Patent Number: 5,362,681
[45] Date of Patent: Nov. 8, 1994

[54] METHOD FOR SEPARATING CIRCUIT DIES FROM A WAFER

[75] Inventors: Carl M. Roberts, Jr., Topsfield; Lewis H. Long, Woburn, both of Mass.; Paul A. Ruggerio, Campbell, Calif.

[73] Assignee: Anaglog Devices, Inc., Norwood, Mass.

[21] Appl. No.: 918,665

[22] Filed: Jul. 22, 1992

[51] Int. Cl.⁵ .......................................... H01L 21/304
[52] U.S. Cl. .................... 437/226; 437/924; 437/974
[58] Field of Search ............ 437/226, 924, 974; 148/DIG. 28; 257/797

[56] References Cited

U.S. PATENT DOCUMENTS

| | | | |
|---|---|---|---|
| 3,537,169 | 11/1970 | Eigeman et al. | 437/226 |
| 4,138,304 | 2/1979 | Gantley | 156/268 |
| 4,522,679 | 6/1985 | Funakoshi et al. | 156/510 |
| 4,915,565 | 4/1990 | Bond et al. | 414/225 |
| 5,171,717 | 12/1992 | Broom et al. | 437/226 |

FOREIGN PATENT DOCUMENTS

| | | | |
|---|---|---|---|
| 54-6456 | 1/1979 | Japan | 437/226 |
| 55-53437 | 4/1980 | Japan | 437/226 |
| 55-107235 | 8/1980 | Japan | 437/226 |
| 57-210641 | 12/1982 | Japan | 437/226 |
| 59-130440 | 7/1984 | Japan | . |
| 59-172740 | 9/1984 | Japan | 437/226 |
| 2009535 | 12/1990 | Japan | B23P 13/00 |
| 0371654 | 3/1991 | Japan | . |
| 4146649 | 5/1992 | Japan | 437/226 |

Primary Examiner—Olik Chaudhuri
Assistant Examiner—David E. Graybill
Attorney, Agent, or Firm—Wolf, Greenfield & Sacks

[57] ABSTRACT

A method for separating individual dies from a wafer in which the wafer is adhered to a plastic film on a film carrier with the circuit side of the wafer facing the film and with circuit components exposed through a hole in the film. In this manner, the circuitry is protected from dust, and trauma from the sawing and cleaning processes because the circuitry is sealed between the film and the non-circuit side of the wafer.

13 Claims, 9 Drawing Sheets

METHOD FOR SEPARATING CIRCUIT DIES FROM A WAFER

FIELD OF THE INVENTION

The present invention pertains to a method and apparatus for separating individual integrated circuit dies from a wafer containing a plurality of dies. More particularly, the present invention pertains to a method and apparatus for sawing a wafer containing extremely fragile componentry.

BACKGROUND OF THE INVENTION

Figure 1A:
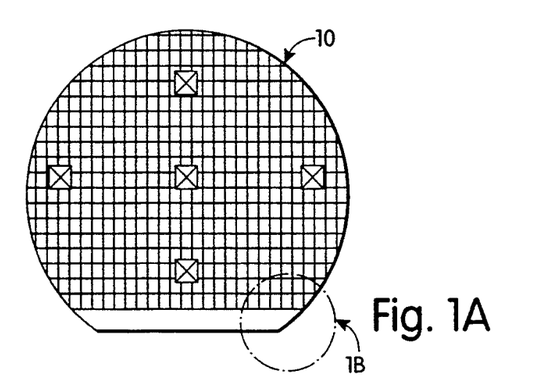
FIG. 1A is a plan view of the circuit bearing surface of an exemplary wafer comprising a plurality of dies.
Figure 1B:
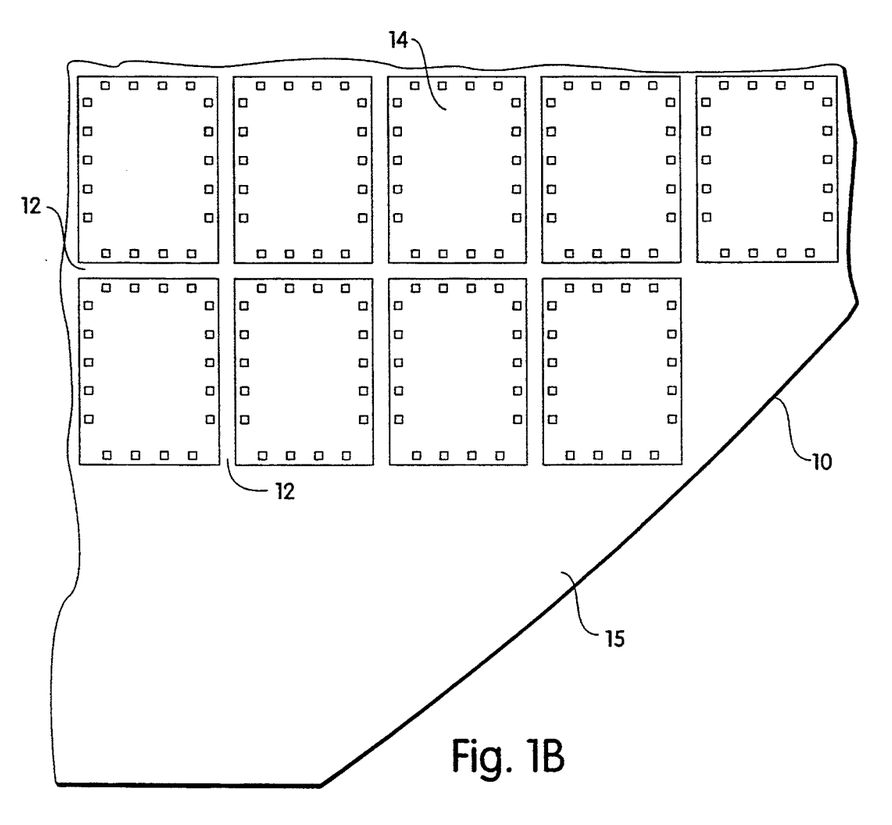
FIG. 1B is a plan view of section A of the wafer shown in FIG. 1A.

In the fabrication of microchips for use in the electronics and computer industries, a wafer is typically fabricated which comprises a plurality of individual dies (or chips) commonly arranged in a grid pattern. The sections of a wafer between the individual dies are termed streets. FIGS. 1A and 1B illustrate an exemplary wafer 10. FIG. 1A is a plan view of a wafer, while FIG. 1B is an enlarged view of section A in FIG. 1A. Reference numerals 14 denote individual dies and reference numerals 12 denote the streets separating the individual dies 14. Streets 12 are simply areas of the wafer where no componentry has been placed and which define the boundaries of each individual die 14. The integrated circuitry and other componentry appears on only one surface, e.g., surface 15, of the wafer. The opposing surface (not shown in FIG. 1) is blank.

The individual dies 14 comprising a wafer are removed from the wafer by sawing through the wafer along all of the streets, thus physically separating the wafer in both axes into the individual dies.

Standard industry practice for separating each wafer up into individual dies is described below.

First, the wafer 10 is placed upside down (i.e., with the circuit side 15 of the wafer 14 facing downwardly and the non-circuit circuit side facing upwardly) on a flat surface. A metal film frame defining an opening is laid over the wafer with the wafer being within the perimeter of the opening in the film frame. A plastic film is then laid over the metal film frame and back (non-circuit side) of the wafer. Preferably, the plastic film is coated with adhesive on the side which contacts the film frame and the back of the wafer. Force is then applied between the film and the film frame to cause the film to adhere well to the frame. One possible technique for applying the force is to pass a rolling pin over the wafer and film frame to adhere the film to the back side of the wafer and to the surface of the film frame. The wafer is now mounted to the film which, in turn, is mounted to the film frame.

The wafer, film, and film frame combination (hereinafter the film frame assembly) is then turned over so that the circuitry on the top of the wafer now faces upwards. The film frame assembly is then placed on a movable pallet in a sawing station. The sawing machine typically comprises a camera and a computerized optical system utilizing optical pattern recognition software which controls movement of the pallet so as to align the streets on the wafer with the saw blade. This can also be done manually by observing a video image obtained by the camera on a screen and manually adjusting the position of the pallet to the desired location. The pallet and wafer is then advanced under the saw blade to cut through the street. Commonly, a wafer has a first plurality of parallel streets aligned in a first direction and a second plurality of parallel streets are aligned orthogonal to the first plurality of streets thus defining a grid with individual dies comprising the blocks between the orthogonal streets.

Accordingly, the wafer will be advanced through the saw blade to cut along a street, shifted laterally to the cutting direction a distance equal to the spacing between the parallel streets and advanced through the saw blade to cut the next street. This process is repeated until all of the first plurality of parallel streets are cut. The pallet and wafer are then rotated 90° and the wafer is advanced through the blade a number of times again to cut through all of the parallel streets in the second orthogonal direction.

The saw blade height is adjusted such that it will cut completely through the wafer and contact and score, but not cut through, the film. The plastic film may be a "Mylar" film of approximately 3 mils in thickness. The blade height would be set, for instance, to cut 1.5 mils into the film.

During the sawing process, water is jet sprayed over the surface of the wafer as well as over the surface of the saw blade to cool the wafer and saw blade.

After the sawing operation, the wafer is transported to a cleaning station where it is sprayed with de-ionized water and brushed to clear away any remaining silicon slurry created by the sawing operation. The wafer typically is then dried after the water flow and brushing operations are completed. The drying may be accomplished in the cleaning station by rapid rotation of the wafer or, alternately, the wafer may be removed to an oven for heat drying. Other drying options are also available.

After cleaning, the film frame assembly is transported to a pick-and-place station where the now detached individual dies are to be removed from the film (to which the dies are still adhered).

The pick-and-place station removes the individual dies from the film and places them, for instance, in a carrier. Commonly, the metal film frame (to which the individual dies are still adhered) is slid into a movable slotted holder in the pick-and-place station which is located above an anvil comprising a needle or needle cluster. A camera is positioned above the anvil and the film frame assembly to obtain an image of a die on the film frame assembly. The image is processed in an optical pattern recognition system and the position of the film frame assembly is adjusted to line up a die with the anvil. The film frame assembly is then clamped in place and a mechanism grasps the film beyond the perimeter of the wafer and stretches the film radially outward. The stretching of the film serves to reduce the film adhesion to the dies at the edge of the dies. After the stretching operation, the anvil is used to further separate the dies from the film. The anvil contains a needle or needle cluster which is advanced upwardly to contact the film underneath the selected die, pierce the film and push the die upwards.

Also under control of the computer and pattern recognition software, an arm having a vacuum-equipped probe is positioned over the top surface of the die. The arm lowers the probe into contact with the die and the vacuum pressure causes the die to attach to the probe. The arm is then controlled to lift the die up and away from the film and transports it over to a grid carrier where the arm descends to position the die in a slot in the carrier and the vacuum is turned off so the die is placed in the carrier. Typically the pick-and-place station will comprise a second camera positioned to obtain an image of the grid carrier and computer control for assuring that the dies are placed in the appropriate receptacles in the grid carrier. The die can then be delivered to the next station for further processing.

U.S. Pat. application Ser. Nos. 07/569,080, now abandoned, 07/872,037, now U.S. Pat. No. 5,314,572 and 07/899,765, now abandoned, pertain to a monolithic accelerometer microchip. Those applications are assigned to the same assignee as the present application and their disclosures are incorporated herein by reference. The microchip comprises both a suspended microstructure for detecting accelerative forces and integrated circuitry for resolving the signal from the sensor into a useful output. The sensor is a variable capacitance capacitor, the capacitance of which changes responsive to acceleration as explained below. One node of the capacitor comprises a polysilicon bridge suspended above the substrate on a series of posts. The polysilicon bridge comprises a suspended longitudinal beam having a plurality of fingers (hereinafter beam fingers) extending transversely therefrom. For each beam finger, there is a corresponding stationary finger positioned parallel and in close proximity thereto. The stationary fingers comprise the other node of the capacitor. The bridge and all of the fingers are electrically conductive. The bridge, including the beam fingers, is charged to a different voltage than the stationary fingers. The polysilicon is resilient such that the bridge, comprising the fingers, will sway under accelerative force such that the spacing between the beam fingers and the stationary fingers, and thus the capacitance of the sensor, will change. The capacitance signal from the sensor is fed to the resolving circuitry on the same substrate which creates a useful output signal indicative of the magnitude of the accelerative force.

When the monolithic accelerometer chip is fabricated, the circuitry portion of the chip is coated with passivation to protect it. However, the microstructure cannot be passivated since it must be able to move freely. In the preferred embodiment, the microstructure is positioned essentially in the center of the microchip (i.e., the die). Due to the fact that the microstructure is comprised of extremely small sections of polysilicon so that it is resilient and the fact that it is not coated with passivation, the microstructure is extremely fragile and great care must be taken during fabrication, up to and including the final packaging steps, not to harm the microstructure. If a wafer comprising a set of monolithic accelerometer dies was passed through the standard die separation process as described above, the microstructures would be destroyed. The water jet sprays used in a sawing process would destroy the microstructure. If any microstructures happen to survive the water spray during the sawing operation, they would be destroyed during the subsequent spraying and brushing in the cleaning operation. Further, if any microstructures survived those two steps, they would probably be destroyed in the pick-and-place station by the vacuum-equipped arm which picks up the dies and places them in the grid carrier.

Accordingly, it is an object of the present invention to provide an improved method and apparatus for separating the individual dies from a wafer containing a plurality of dies.

It is a further object of the present invention to provide a method and apparatus for separating individual dies from a wafer comprising a plurality of dies which will not damage fragile portions of the dies.

SUMMARY OF THE INVENTION

In the present invention, the wafer is attached to a thin plastic film as in the prior art, except that instead of mounting the back side of the wafer to the film, the top surface containing the componentry is mounted to the film. If the dies on the wafer contain particularly fragile components, such as a suspended microstructure, which might be damaged if adhered to the film, then, before mounting, holes are punched in the film of a size and relative position to one another such that the holes will match up to the microstructures on each die on the wafer.

The film is laid on and attached to a film frame prior to introduction of the wafer. The film frame assembly is then placed in a hole punch machine which accurately punches holes in the film to correspond to the microstructures on the wafer. The wafer is then precision aligned parallel and adjacent to the film such that the microstructure regions are adjacent to the holes. The film and the wafer are then brought into contact such that the circuit side of the wafer contacts and becomes adhered to the film. The microstructure regions on the wafer do not contact the film since they are adjacent to the holes in the film.

During the hole punching operation, an additional set of holes (termed alignment holes herein) is punched in the film in locations which will be outside of the perimeter of the wafer when the wafer is mounted to the film. These holes are placed with precision and aligned relative to the microstructure holes such that the position of the streets on the wafer will be precisely known relative to the alignment holes when the wafer is mounted to the film, even though the streets will not be visible since the wafer will be mounted upside-down on the film. Accordingly, the sawing station camera will use the alignment holes for aligning the saw blade to the streets rather than the actual streets. Alternately, ink dots or other indicia may be placed on the film or elsewhere, instead of alignment holes.

In the preferred embodiment of the invention, another thin plastic film is adhered to the back side of the first plastic film so as to seal off the open end of the punched holes and seal the microstructure region to prevent water and dust from reaching it.

After the second layer of film is adhered to the first layer of film, the film frame assembly, comprising the two layers of film and the wafer, is placed on a pallet (or chuck plate) in a sawing station with the wafer upside down. The camera on the sawing station observes the wafer and pattern recognition software determines the position of the alignment holes. The pallet is then moved to align a street (whose position is known relative to the alignment holes) with the saw blade. A normal sawing operation will thereafter be performed in which all of the streets in a first orthogonal direction are sawed, the wafer is rotated 90° and the streets in the other orthogonal direction are then sawed. The water jet spray does not affect the microstructures because they are sealed within the film.

The film frame assembly is then delivered to a pick-and-place station. The film frame assembly is placed in a slot in the pick-and-place station with the wafer upside down. A needle assembly rises from under the film frame assembly and presses against the film thereby lifting the individual dies as the film flexes. A special needle assembly comprising a cluster of ball point needles is used in the preferred embodiment of the invention. So as to prevent a needle from contacting the film adjacent to the microstructure region, which could become damaged from pressure from the needle, the needles are arranged so as to surround the microstructure region (i.e., the hole in the film).

An arm having a vacuum probe on its end and positioned above the die swings over the top of the die, vacuum attaches to the non-circuit side of the die (which is facing upwardly at this point) and picks it up off the film. This arm swings over to a second arm having a vacuum probe on its end and positioned beneath the first arm (and, therefore, beneath the die also) and places the die on the probe on the second arm. The second probe contacts and vacuum attaches to the die on the circuit side, which is facing downwardly. Again, in order to prevent damaging the microstructure, the probe on this arm is specially designed. The vacuum probe on this arm comprises an annular ring which will surround the microstructure so that the vacuum will not affect the microstructure. The second arm rotates 180° on its longitudinal axis so that the die is now oriented with the componentry facing upwardly. The second arm is positioned with the probe above, for instance, a grid carrier and releases the vacuum such that the die is placed in the grid carrier. The die is now in the grid carrier with its circuit side facing upwardly.

DETAILED DESCRIPTION OF A PREFERRED EMBODIMENT OF THE INVENTION

The process and apparatus of the present invention will now be described with respect to a wafer comprising monolithic accelerometer dies as described above and in the above-identified patent applications incorporated herein. It should be obvious to those skilled in the related arts, however, how the method and apparatus described hereinbelow can be modified for use in sawing other dies.

Figure 2:
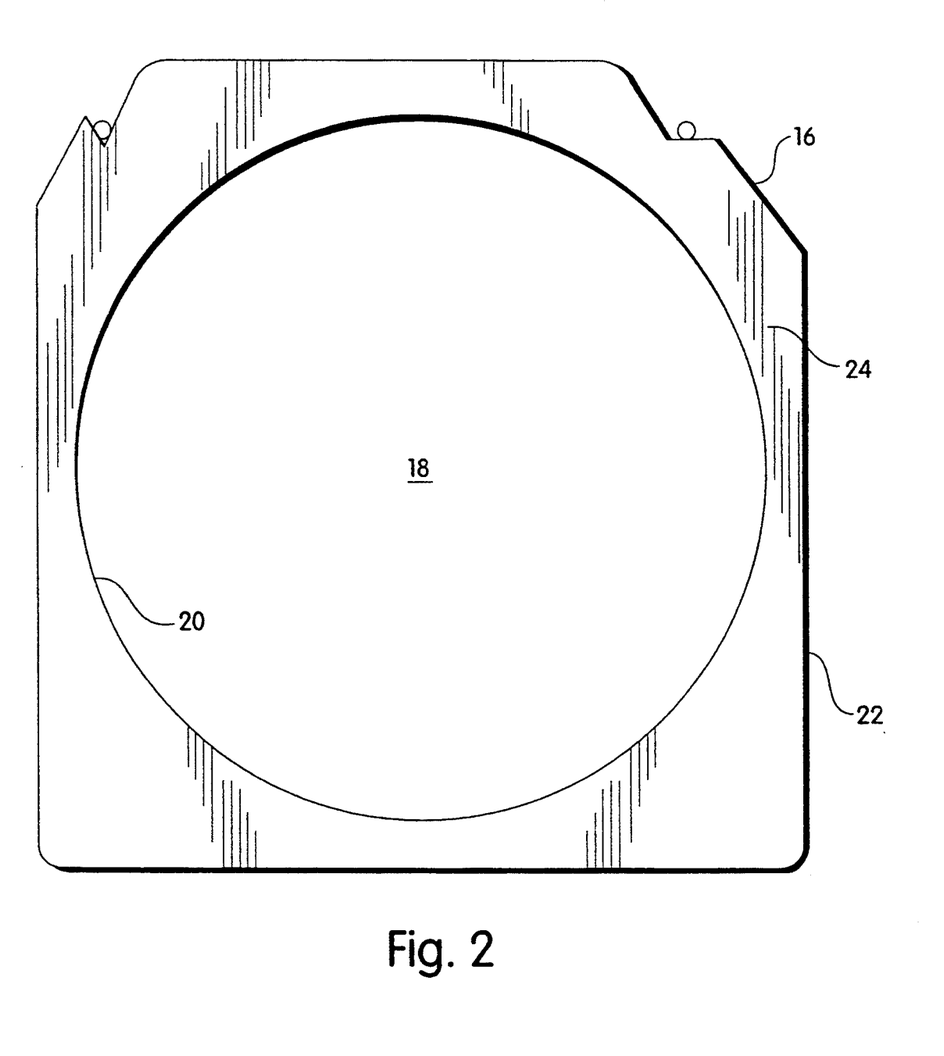
FIG. 2 is a plan view of a film frame.
Figure 3:
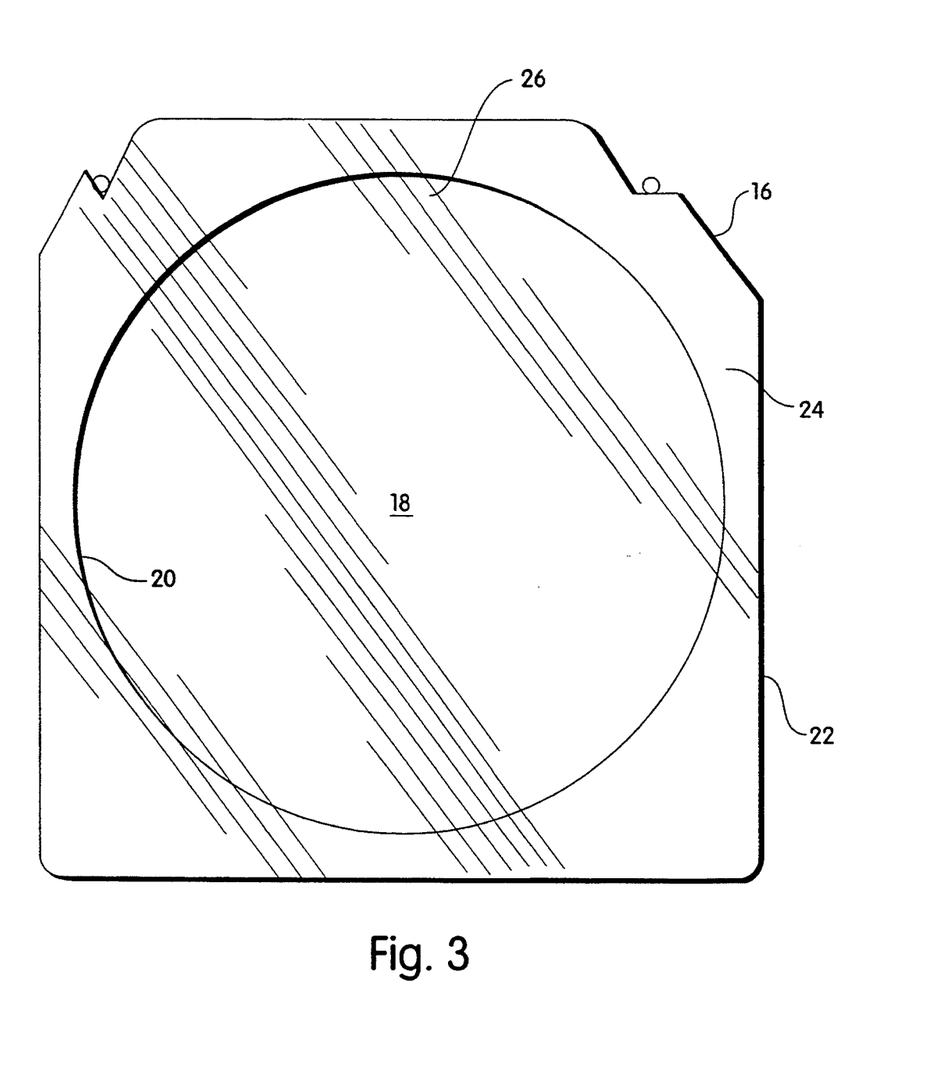
FIG. 3 is a plan view of the film frame of FIG. 2 bearing a first layer of film.

FIG. 2 is a plan view of an exemplary film frame for use in the process and apparatus of the present invention. The frame 16 is a thin frame constructed, for example, of a metal or plastic and defining a generally circular opening 18 having a perimeter 20. A thin plastic film will be mounted to this frame as illustrated in FIG. 3. The film will act as a carrier for the wafer throughout the process described herein. The film 26 is preferably a "Mylar" film of approximately 5 mils in thickness. More preferably, the film 26 is coated with an adhesive on one side which will cause the film 26 to adhere to the surface 24 of the film frame 16 and to a wafer.

In at least one preferred embodiment, the film frame is placed on a pallet in a film carrier station which comprises a roller of film adjacent to the pallet such that the film can be rolled off of the roller onto the film frame. The film is rolled off of the roller and placed flat onto surface 24 of the film frame 16. A rubber rolling pin may be used to apply pressure to the film and force it down to make good contact and adhere to film frame surface 24. A knife can then be used to cut around the perimeter 22 of film frame 16 to remove all excess film.

The film frame assembly is then transported to a hole punch station where it is placed on a pallet having an opening generally corresponding to the opening 18 in the film frame. The punching station comprises a punch assembly for punching holes 28 in the film (see FIG. 4). The punching station is programmed to punch holes 28 in the film in a programmable predetermined pattern corresponding to the relative positions of the microstructures on the wafer. The punch is selected to punch holes of a size slightly larger than the microstructures. When the wafer is fixed to the film frame assembly, it will be crucial to align the wafer with the holes such that the holes match up with the microstructures.

An additional set of alignment holes 30a and 30b are punched in the film such they will be beyond the perimeter of the wafer when the wafer is adhered to the film. Alignment holes 30a define a first line in a first direction, while alignment holes 30b define a second line in a second direction which is typically orthogonal to the first direction. Alignment holes 30a and 30b are precision placed relative to holes 28 so that the position of the lines defined by them relative to the positions of the streets of the wafer when the wafer is adhered to the film will be precisely known. It is not necessary that the holes 30a and 30b be on the same line with any given street of the wafer. It is only necessary that the position of the lines defined by holes 30a and 30b are known relative to the positions of the streets on the wafer. For instance, it can be seen in FIG. 4 that holes 30a define a line which bisects a line of holes 28. Accordingly, holes 30a are not on the same line as a street, since a street obviously cannot go through the microstructures. However, it is known that when a wafer is adhered to the film such that the microstructures match up with holes 28, there will be a street parallel to the line defined by holes 30a but offset a known distance from that line and that all of the streets in the first orthogonal direction are parallel to this street and offset from each other by another known distance.

Alternately, alignment ink dots may be placed on the film instead of alignment holes. It is a common industry practice to place ink dots on unacceptable dies during inspection. The apparatus for placing the ink dots on the unacceptable dies can easily be modified to place alignment ink dots on the film beyond the perimeter of the wafer. For instance, in standard inspection protocol, the dies are inspected under a microscope in an semiautomated inspection station. When the operator observes an unacceptable die, he or she presses a button on the station which translates the wafer on a straight line to an ink dot applicator such that the die which was under the microscope is now under the applicator. The applicator then places a drop of ink on the die and the wafer is translated back to its previous position underneath the microscope. This same inspection station can be adapted to place alignment ink dots on the film in a film frame beyond the perimeter of the wafer. For instance, a punched film frame of the present invention (i.e., having the microstructure clearance holes therein) could be placed in the inspection station. The operator would then move the film frame such that a beam clearance hole near the outer edge of the wafer is positioned under the microscope. The translation distance that the wafer is moved when transferring to the ink applicator can be changed such that when the operator presses the button to transfer from the microscope to the ink applicator, the wafer is moved in a straight line a slightly different distance than would be used during normal inspection such that the ink applicator drops a dot of ink, not in the hole which was under the microscope, but in a location on the film which is offset a specified distance therefrom. This specified distance, of course, would be selected such that the ink dot is placed beyond the perimeter of the wafer. The operator would simply place a series of microstructure clearance holes defining a straight line under the microscope and press the button so as to produce ink dots beyond the perimeter of the wafer defining a straight line.

Figure 4:
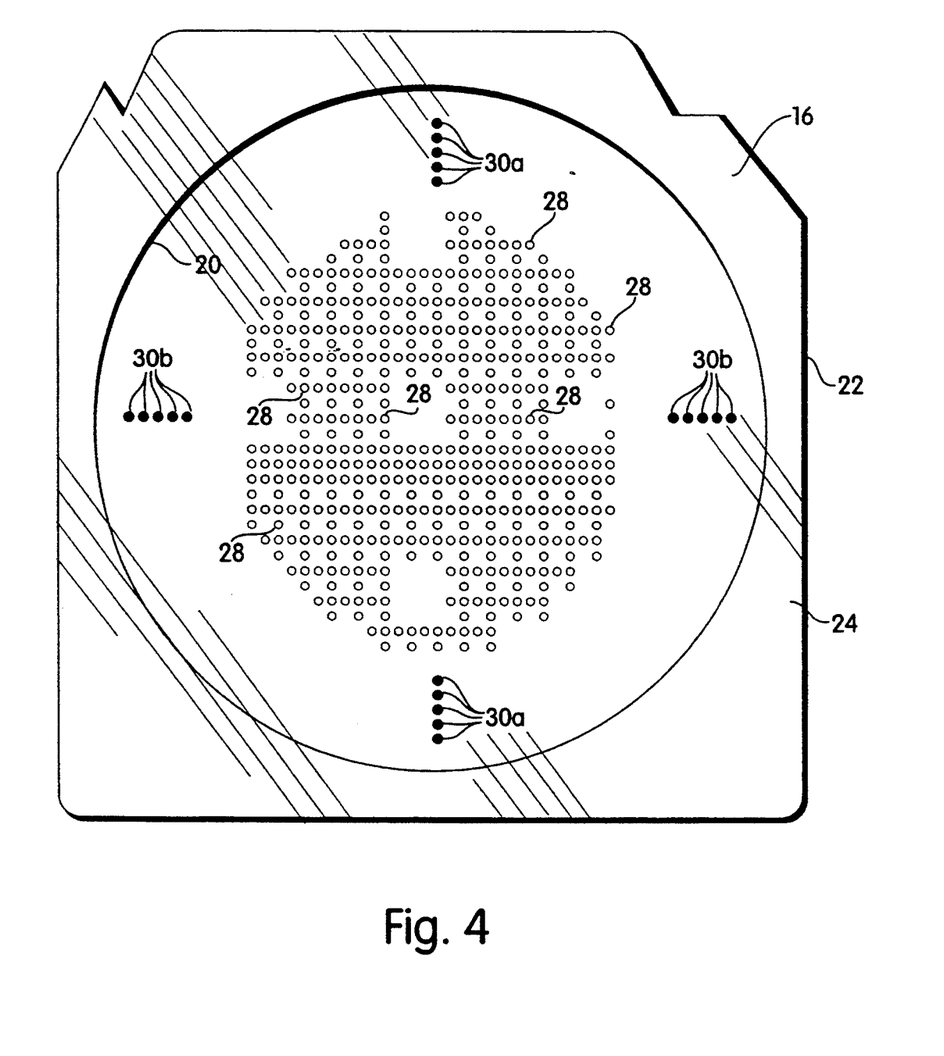
FIG. 4 is a plan view of the film frame of Figs. 2 and 3 bearing the first layer of film after it has been processed through a hole-punching station.

At this point, the film frame assembly is returned to the film carrier station and a second layer of film, preferably a 3 mil thick "Mylar" film, is adhered to the first layer of film. The second layer of film has no holes and, therefore, seals one end of the holes 28, 30a and 30b punched in the first layer of film 26. Alternately, the second layer of film can be added after the wafer is mounted to the film frame assembly.

The wafer must now be fixed to the opposite side of the first layer of film 26 (i.e., the side where the holes are still exposed). First, the wafer is placed on a chuck in a precision aligning and mounting station with the circuit side facing up. A pair of cameras positioned above the chuck obtains images of different areas of the wafer placed on the chuck. The images are transferred to a pair of video screens (or are shown split screen on a single monitor). An operator observes the video images and aligns the wafer in the desired position. For instance, the video monitor may have cross hairs represented thereon which can be used for alignment purposes. The film frame assembly is then inserted in a slot above the chuck with surface 24 of the film frame facing down such that the side of the first layer of film film 26 where the holes are still exposed is facing down towards the circuit side of the wafer. When the film frame assembly is inserted into the machine, the cameras obtain images of the holes in the film. The operator then observes the new images of the holes and aligns them to be in proper orientation with respect to the wafer. In a more preferred embodiment of the invention, the aligning station is computer controlled and includes pattern recognition software such that alignment of the holes in the film frame with the wafer is accomplished automatically.

In the present invention, a rolling pin cannot be used to adhere the film to the wafer since rolling pin action could disturb the alignment but more importantly because the rolling pin could damage the microstructure. Accordingly, in the preferred embodiment of the invention, the aligning and mounting station is designed so that it can be sealed and evacuated to form a vacuum. Then, the chuck containing the wafer can be brought into contact with the film such that the film and wafer adhere to each other. Even more preferably, after the evacuation and contact between the film and the wafer, the chamber is then repressurized to atmospheric pressure, thus exerting a compressive force between the film and wafer to assure adequate adhesion between the circuit side of the wafer and the film.

Figure 5:
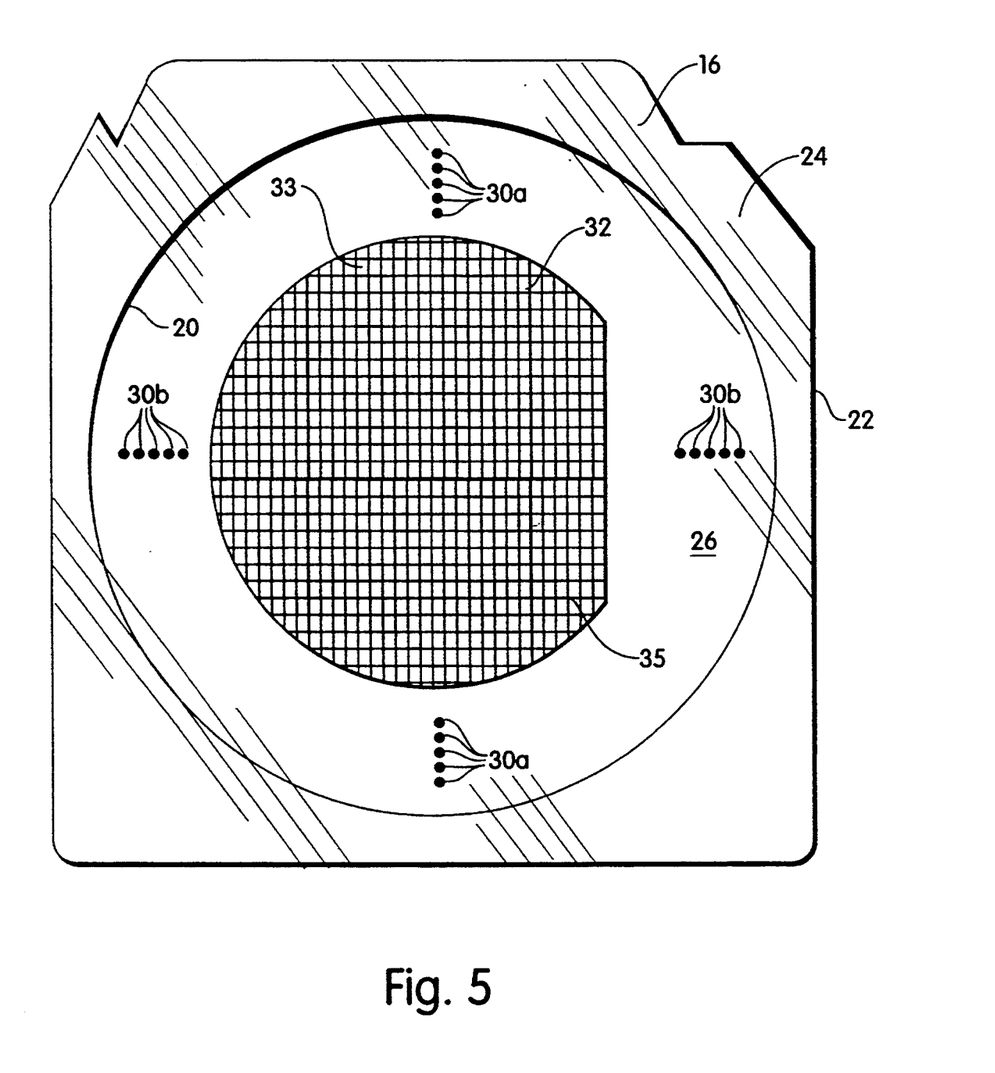
FIG. 5 is a plan view of the film frame assembly of FIGS. 2, 3 and 4 having a wafer mounted thereto with the circuit side facing the film.

FIG. 5 illustrates the film frame assembly after the wafer 32 has been adhered to the film 26 with its non-circuit side 33 facing away from the film 26. Holes 28 are underneath the wafer and cannot be seen. Holes 30a and 30b, however, are exposed beyond the perimeter 35 of the wafer. The film frame assembly, including the wafer 32, are now placed on a pallet at a sawing station. The pallet may be a vacuum chuck which is essentially a table having therein in which a vacuum is applied to force the wafer down fixedly onto the table. The sawing station comprises a camera which obtains the image of the film frame assembly and determines the position of holes 30a or 30b. The sawing station is programmed with a map of the wafer indicating the relative position of each street relative to the lines defined by holes 30a and 30b. The pallet and film frame assembly are then advanced through the saw and shifted laterally to the saw blade cutting direction as many times as necessary to saw each street in the first orthogonal direction. The pallet is then rotated 90°, realigned to the second set of alignment holes, and the pallet and film frame assembly are advanced into the saw and laterally shifted again the number of times necessary to saw through all of the streets in the second orthogonal direction. If the sawing station tolerances are small enough with respect to the 90° rotation and linear distance, it may not even be necessary to realign the wafer with respect to the second set of alignment holes.

The height of the saw blade is selected to cut completely through the wafer and score the first layer of film without cutting completely through it.

In the preferred embodiment, the saw blade is approximately 1.3 mils thick with a 35 mil exposure and rotates at a rate of approximately 30,000 rpm. The first layer of film is 5 mils thick and the second layer of film is 3 mils thick. The saw blade height is set to cut approximately 2.5 mils into the first layer of film. The saw blade is a carbide saw blade having a diamond tipped cutting surface.

As is common in the sawing of wafers, during the sawing process, jets of de-ionized water are sprayed on the wafer to keep it cool. Another jet of water is sprayed on the saw blade in order to keep it cool also. As noted in the Background of the Invention section, the water jets would normally destroy an exposed microstructure on a wafer, even if the water was slowed to a trickle. However, in the present invention where the wafer 32 is adhered with its circuit side facing down and bonded to the film 26, the microstructures are sealed between the back side of the wafer and the film such that the water cannot penetrate into the circuit side of the wafer to damage the microstructures. Accordingly, the microstructures as well as all other circuitry on the wafer will not be affected by the water. After the sawing process, the film frame assembly, including the wafer, goes through a normal cleaning process which includes additional spraying with de-ionized water and brushing to remove any silicon slurry. Again, since the wafer 32 is adhered to the film 26 with its circuit side 31 in contact with the film 26, the microstructures and all other circuitry are sealed from the water and are not affected thereby.

The film frame assembly is now transported to a pick-and-place station which will remove the individual dies from the film. The pick-and-place station will typically either place the dies in a grid carrier or on a further film frame for further processing.

The pick-and-place station is similar to a standard pick-and-place station but with several key distinctions. First, the pick-and-place station must turn over the dies before placing them on the grid carrier so that the circuit side 31 faces upwards. Further, precautions must be taken to assure that the needles and vacuum equipped probes do not damage the extremely fragile microstructures.

Figure 6:
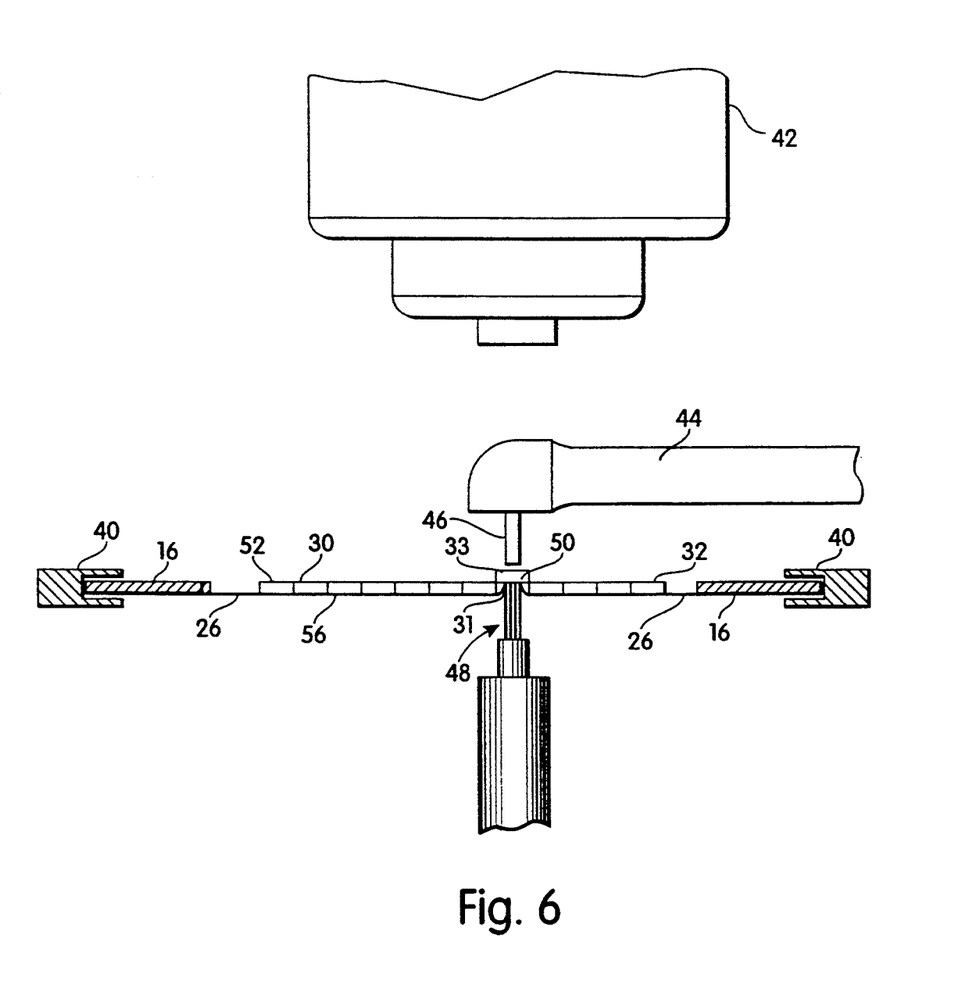
FIG. 6 is a cross-sectional view of a first portion of an exemplary pick-and-place station which can be used in the present invention.

FIG. 6 is a cross-sectional view generally illustrating a first portion of an exemplary pick-and-place station for use in the present invention. The pick-and-place station comprises a first slot 40 in which the film frame assembly is placed. A camera 42 is positioned above the slot so that the camera can obtain the image of the wafer 32 and the individual dies 50, 52, 54, 56, etc. (Note that the sawn streets are now visible from the back side of the wafer such that the position of each individual die can be directly determined by the camera.) The pick-and-place station further comprises a first arm 44 bearing a vacuum probe 46 for lifting the individual dies off of the film.

Rather than a single needle to pierce the film and push up against the dies so that the die becomes detached from the film, a specially designed needle cluster 48 is employed. Since the circuitry side 31 of the wafer 32 is face down in contact with the film, extra precautions in order not to harm the microstructure or the circuitry must be taken with respect to the needle cluster for lifting the die. A single needle pressing up against the die in the middle of the die would exert a force on a microstructure or other circuitry and likely damage it. Accordingly, instead of using a single needle, in the preferred embodiment, a cluster 48 of four needles which will surround the microstructure is employed. Further, instead of being pointed, the ends of the needles are semi-spherical to even further reduce the possibility of damage to the microstructure or circuitry.

Figure 7:
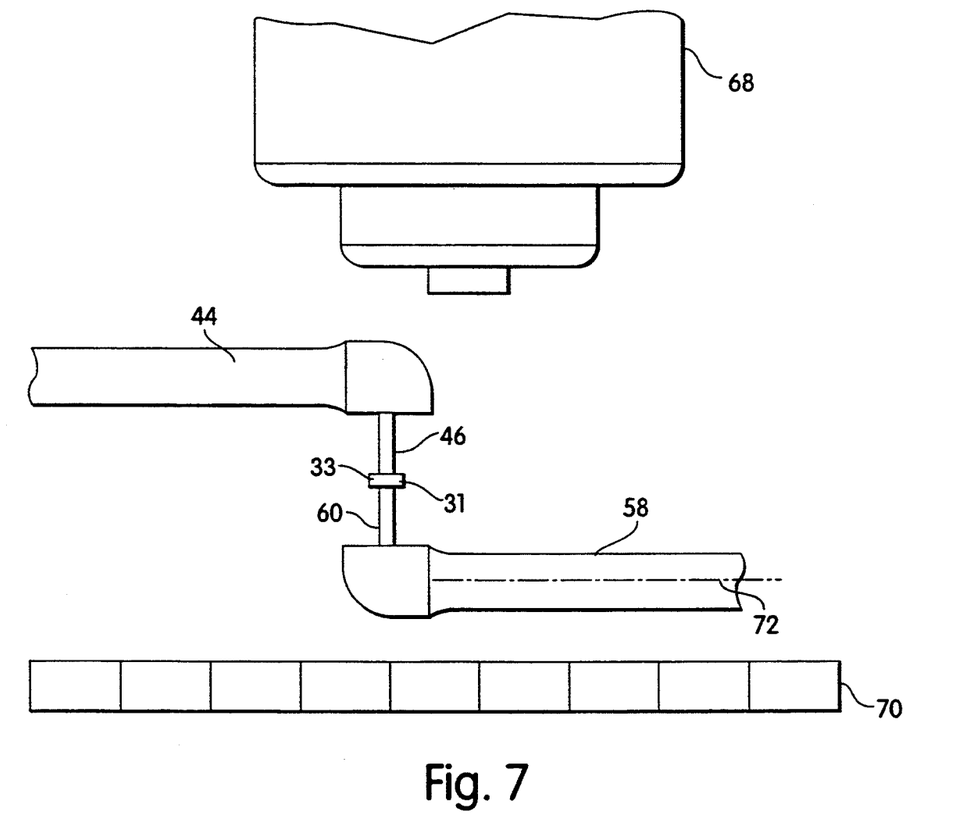
FIG. 7 is a side view of a second portion of the exemplary pick-and-place station shown in FIG. 6.

The needle cluster 48 rises from under the film frame assembly and presses against the film 26 thereby lifting the die 50. The ball point needles preferably do not pierce the film, but instead cause it to deform under the pressure of the needles into a generally paraboloidal shape, thus substantially separating the die from the film which will only contact the die adjacent to the tips (ball points) of the needles. The first arm 44 then swings over the lifted die, lowers a picking device, such as vacuum probe 46, into contact with it and picks it up off of the film. Since this arm is contacting the non-circuit side 33 of the wafer 32, no special precautions are necessary with respect to vacuum probe 46. The first arm 44 then swings around to meet a second arm 58 also bearing a vacuum-equipped probe 60 as illustrated in FIG. 7. Probe 60 is positioned above a grid carrier or possibly above a second film frame.

Figure 8:
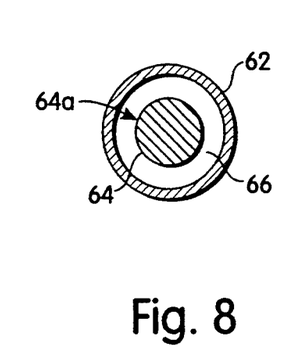
FIG. 8 is a cross-sectional plan view of an exemplary vacuum probe tip for use in the pick-and-place station of the present invention.

However, since the probe of the second arm will contact the circuit side 31 of the die 50, precautions must be taken not to damage the microstructure which is positioned in the center of the die. Accordingly, the vacuum probe tip is constructed as shown in FIG. 8 to apply only an annular ring of vacuum surrounding the microstructure. As shown in FIG. 8, a ring 62 surrounds a solid core 64. The vacuum is applied only in the annular hollow 66 between ring 62 and core 64. The core 64 is sized and shaped to be at least as large as the microstructure. The second arm 58 is computer controlled such that when the probe 60 contacts the die 50, the core 64 completely overlays the microstructure and protects it from the vacuum. More preferably, the tip of core 64 is parabolic (i.e., cup shaped) or countersunk such that only the rim 64a of the core 64 contacts the die, and does so beyond the perimeter of the microstructure. When the probe 60 contacts the die 50, the vacuum is released on the first probe 46 so that the first arm 44 releases the die and the second arm 58 takes it.

Figure 9:
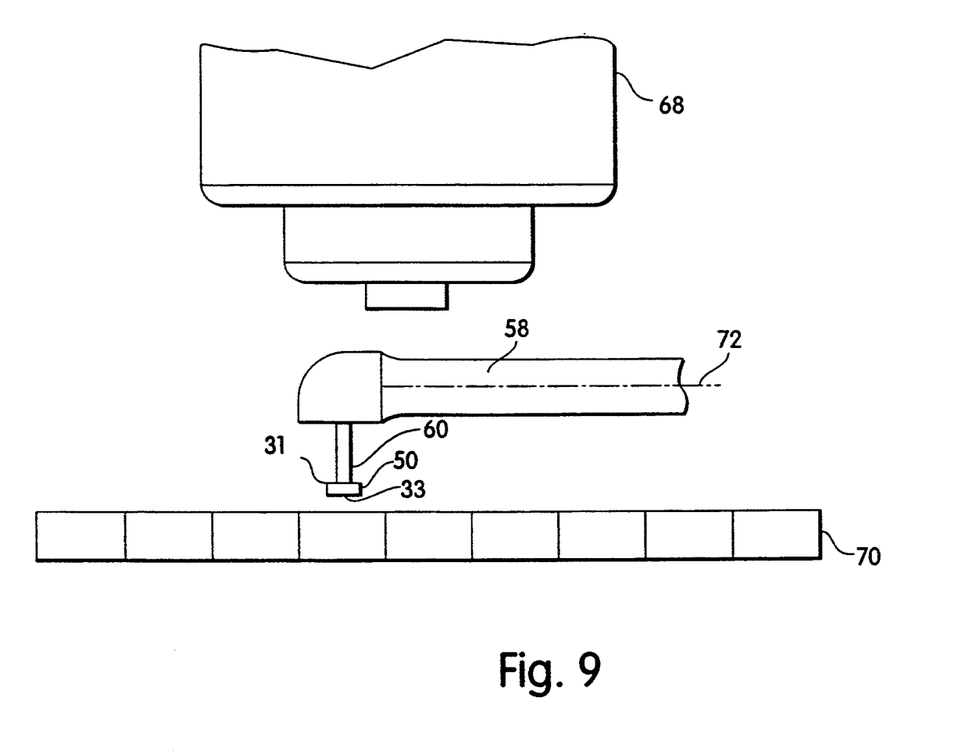
FIG. 9 is a cross-sectional view of a third portion of the exemplary pick-and-place station shown in FIGS. 6 and 7.

The second arm rotates 180° about its longitudinal axis 72 so that the probe points downwardly and the die now has its circuit side 31 facing up and is positioned above, for instance, a grid carrier 70 as illustrated in FIG. 9. Under computer control, a second camera 68 above the grid carrier 70 observes the position of the die 50 relative to the grid carrier 70 and the pallet upon which the grid carrier is positioned is controlled so an unoccupied slot in the carrier is placed directly beneath the die 50. The vacuum is then turned off and the die 50 is placed, with its circuit side 31 facing up, into the grid carrier 70.

As those skilled in the art will realize, typically, the individual dies on a wafer are tested prior to the process described hereinabove. Commonly, those individual dies which do not function properly are marked with an ink dot to indicate that they are non-operating parts and should be discarded. Also, typically, the pick-and-place station is programmed to recognize the dots and to not pick dies bearing dots. In the present invention, however, ink dots placed on the circuit side of the die are not observable by the pick-and-place station camera because the wafer is placed upside down on the film. Accordingly, in the preferred embodiment, a wafer map is created during the testing process indicating which individual dies on the wafer are acceptable parts and which are not. That map is loaded into digital memory of the pick-and-place station which can use that map to determine which individual dies it must pick and which it can leave on the film to be discarded. The map which is created by the die testing apparatus must be electronically inverted before being used in the pick-and-place station because the wafer is upside down in the pick-and-place station and, therefore, each individual die is in the opposite position from which it was in when the wafer was in the right side up position in the die testing apparatus.

Figure 10:
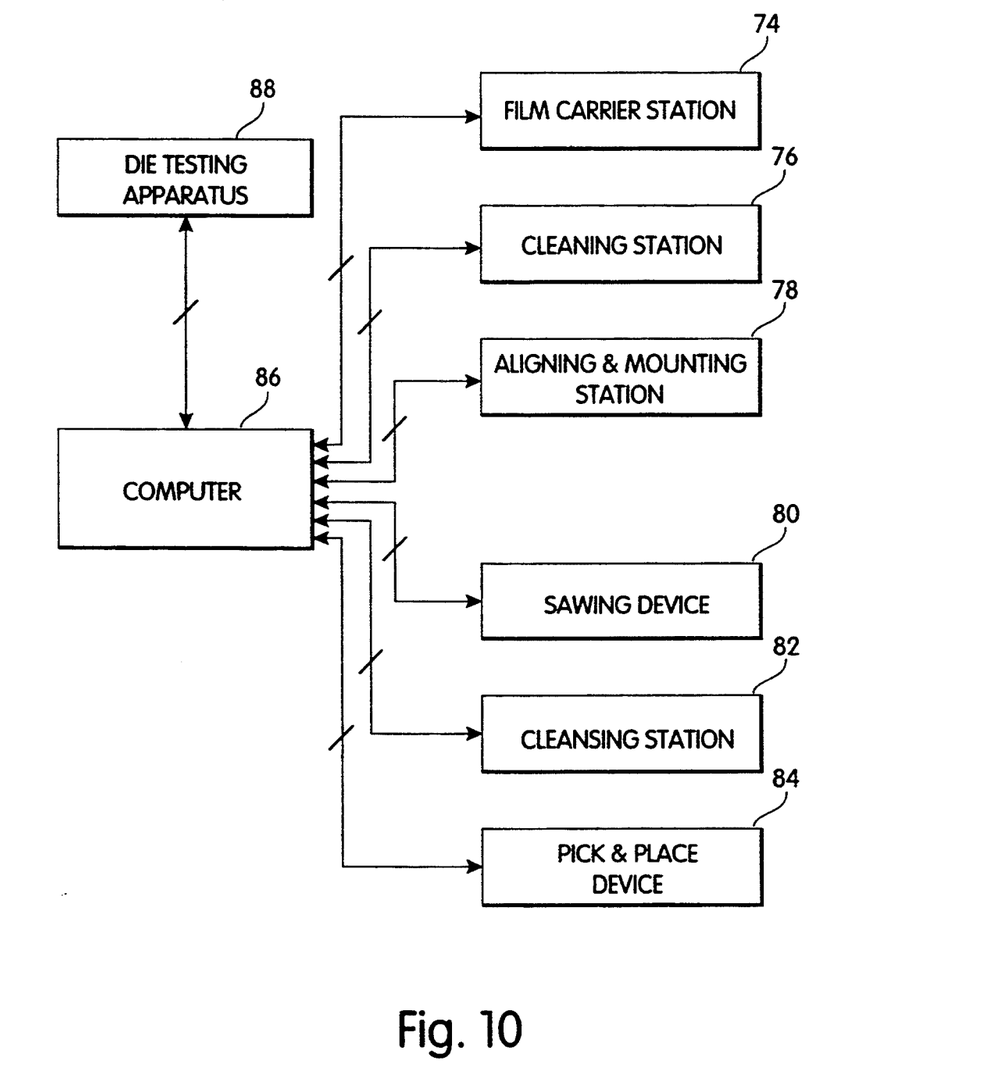
FIG. 10 is a block diagram showing the components of the apparatus of the present invention.

FIG. 10 is a block diagram generally illustrating the various components of the apparatus for carrying out the present invention. The apparatus comprises a film carrier station 74, a hole punching station 76, an aligning and mounting station 78, a sawing station 80, a cleaning station 82 and a pick-and-place station 84. FIG. 10 shows all of the stations under the control of a single computer controller 86. Of course, each individual device may comprise its own microprocessor and the stations need not all be connected to a single computer controller. As further illustrated in FIG. 10, in the preferred embodiment, means are provided for transferring a wafer map generated by a die testing apparatus 88 to the computer controller 86 for use in the pick-and-place station 84 for determining which dies should be picked and which dies should not be picked. Of course, it is also possible that the film carrier may also be automated and, therefore, coupled to receive instructions from the computer and/or provide information to the computer.

Having thus described a few particular embodiments of the invention, various alterations, modifications and improvements will readily occur to those skilled in the art. For instance, the vacuum probes could be replaced by mechanical grippers which grasp the side edges of the chip. This structure could be used in an embodiment of the invention having only a single arm and grippers. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of separating an individual microcircuit die from a wafer comprising a plurality of dies containing componentry on a first side thereof, including at least a first component, said wafer comprising at least one street separating said dies from each other, said method comprising the steps of:
   (1) placing clearance holes in a protective film, said clearance holes having a size corresponding to said first component,
   (2) fixing said first side of said wafer to a first side of a protective film such that said clearance holes in said protective film align with said first component,
   (3) sawing said wafer along said at least one street whereby at least one of said dies is detached from all of the other dies on said wafer, and
   (4) removing said at least one detached die from said protective film.

2. A method as set forth in claim 1 wherein step (2) comprises:
   (2.1) placing said film and said wafer in a vacuum chamber,
   (2.2) evacuating said chamber,
   (2.3) causing said first side of said wafer to contact a first side of said protective film, said film comprising a plastic film bearing adhesive on said first side, and
   (2.4) repressuring said chamber.

3. A method as set forth in claim 1 further comprising the step of:
   attaching a second film to a second side of said protective film prior to step 3, said second side being opposed to said first side.

4. A method as set forth in claim 1 where step (4) comprises the steps of:
   (4.1) applying pressure to said at least one detached die through said protective film so as to cause said protective film to deform whereby said die is raised away from a plane defined by said wafer and at least part of said die loses contact with said film, and
   (4.2) picking said die on a second side thereof with a first picking tool, said second side being opposite said first side, and lifting said die away from said film.

5. A method as set forth in any one of claims 1, 3, and 4 further comprising the step of:
   prior to step (3) placing at least one indicator on said protective film for indicating the location of said at least one street when said wafer is attached to said protective film.

6. A method as set forth in claim 5 wherein said indicator comprises at least two alignment holes positioned in said film outside of a perimeter of said wafer when said wafer is attached to said protective film, said alignment holes defining a line.

7. A method as set forth in claim 6 wherein said indicator comprises at least first and second sets of alignment holes positioned outside of said perimeter of said wafer when said wafer is attached to said protective film, said first and second sets of alignment holes defining first and second orthogonal lines, respectively.

8. A method as set forth in claim 5 wherein said indicator is at least two ink dots positioned in said film outside of a perimeter of said wafer when said wafer is attached to said protective film.

9. A method as set forth in claim 3 further comprising the step of:
   precision positioning said wafer on said film relative to said clearance holes so that said first components correspond in position with said clearance holes.

10. A method as set forth in any one of claims 1, 3, and 4 further comprising the steps of:
    creating a map of said wafer indicating which dies on said wafer are acceptable, and
    only removing said acceptable dies from said wafer.

11. A method as set forth in claim 4 wherein step (4.1) comprises applying pressure via a cluster of blunt needles which contact said protective film beneath said die without puncturing said film.

12. A method as set forth in claim 11 further comprising the steps of:
    (5) positioning a second picking tool having an annular vacuum chuck adjacent said first side of said die, said annular chuck shape and sized to have a central portion where a vacuum is not applied corresponding to a shape and size of said first component and an annular portion surrounding said central portion where vacuum is applied, and
    (6) causing said annular vacuum chuck to contact said first side of said die such that said central portion of said annular vacuum chuck is applied to said chip in an area not occupied by said first component.

13. A method as set forth in claim 12 wherein step (5) comprises positioning a second picking tool having an annular vacuum chuck, the central portion thereof being parabolic in shape so as not to contact said first circuit component.

* * * * *

UNITED STATES PATENT AND TRADEMARK OFFICE
CERTIFICATE OF CORRECTION

PATENT NO. : 5,362,681
DATED : November 8, 1994
INVENTOR(S) : Carl M. Roberts, Jr., Lewis H. Long and Paul A. Ruggerio It is certified that error appears in the above-identified patent and that said Letters Patent is hereby corrected as shown below:

Title Page item [73],

Assignee: please replace "Anaglog Devices, Inc. with --Analog Devices, Inc.--.

Signed and Sealed this

Twenty-sixth Day of September, 2000

Attest:

Q. TODD DICKINSON

*Attesting Officer*      *Director of Patents and Trademarks*